(12) United States Patent
Huang et al.

(10) Patent No.: US 6,249,138 B1
(45) Date of Patent: Jun. 19, 2001

(54) METHOD FOR TESTING LEAKAGE CURRENT CAUSED SELF-ALIGNED SILICIDE

(75) Inventors: Michael WC Huang, Taipei Hsien; Gwo-Shii Yang, Hsinchu; Hsiao-Ling Lu, Taipei Hsien; Wen-Yi Hsieh, Hsinchu, all of (TW)

(73) Assignees: United Microelectronics Corp.; United Silicon Incorporated, both of Hsinchu (TW)

( * ) Notice: Subject to any disclaimer, the term of this patent is extended or adjusted under 35 U.S.C. 154(b) by 0 days.

(21) Appl. No.: 09/447,846

(22) Filed: Nov. 23, 1999

(51) Int. Cl.[7] ............................................. G01R 31/26
(52) U.S. Cl. ..................... 324/765; 324/719; 438/14; 438/17
(58) Field of Search ................................ 324/765, 766, 324/719; 438/14, 17; 257/48, 382, 383, 384

(56) References Cited

U.S. PATENT DOCUMENTS

| | | | |
|---|---|---|---|
| 4,542,340 | * 9/1985 | Chakravarti et al. | 324/769 |
| 4,588,946 | * 5/1986 | Lin | 324/767 |
| 5,420,520 | * 5/1995 | Anschel et al. | 324/760 |
| 5,600,578 | * 2/1997 | Fang et al. | 324/765 |
| 5,638,006 | * 6/1997 | Nariani et al. | 324/765 |
| 5,943,550 | * 8/1999 | Fulford, Jr. et al. | 438/14 |
| 6,043,102 | * 3/2000 | Fang et al. | 438/14 |

* cited by examiner

*Primary Examiner*—Safet Metjahic
*Assistant Examiner*—Jermele M. Hollington
(74) *Attorney, Agent, or Firm*—Charles C.H. Wu; Charles C.H. Wu & Associates, APC

(57) ABSTRACT

A method of testing a leakage current caused by a self-aligned silicide process is described. The invention uses different test structure to monitor degree of and reason for a leakage current caused by a self-aligned silicide process. While monitoring a self-aligned silicide process performed on a metal-oxide semiconductor transistor without a LDD region, in addition to considering a leakage current occurring from the metal silicide layer to the junction and occurring at edge of the metal silicide layer, the invention further considers a leakage current at comer of the metal silicide layer. For a metal-oxide semiconductor transistor having a LDD region, the invention further considers a leakage current from the metal silicide layer to the LDD region. The invention monitors a leakage current at comer of the metal silicide layer.

12 Claims, 5 Drawing Sheets

METHOD FOR TESTING LEAKAGE CURRENT CAUSED SELF-ALIGNED SILICIDE

BACKGROUND OF THE INVENTION

1. Field of Invention

The present invention relates to a method for testing reliability of a self-aligned silicide process. More particularly, the present invention relates to a method for testing a leakage current caused by self-aligned silicide, using different test structures after a self-aligned silicide process.

2. Description of Related Art

In a conventional method for testing reliability of a self-aligned silicide process, test structures, as shown in FIG. 1 and FIG. 2, are commonly deposited on wafer scribe lines. These test structures include a big diffusion region 102 (FIG. 1), or multiple bars of diffusion regions 102 on the wafer 100 (FIG. 2), and a metal silicide layer 104 thereon. These test structures and a metal-oxide semiconductor (MOS) transistor in a chip are simultaneously formed, therefore, the test structures can monitor reliability of the self-aligned silicide layer on a source/drain region of the MOS transistor to avoid malfunction of the MOS transistor. The two test structures (shown in FIG. 1 and FIG. 2) are designed according to a leakage current occurring from the metal silicide layer to the junction, and a leakage current occurring at the edge of the metal silicide layer. Therefore, design parameters of the two test structures in FIGS. 1 and 2 include area and perimeter of the metal silicide layer.

Accordingly, the conventional method for testing reliability of a self-aligned silicide process is to measure a current of the test structure shown in FIG. 1 or FIG. 2, and then calculate current density from the metal silicide to the junction region and current density of the edge of the metal silicide. According to these two current densities, the leakage current caused by the metal silicide layer can be monitored. If the leakage current is not in an allowable range, the self-aligned silicide process has to be immediately rectified so as to reduce wafer nullity probability.

However, when the test structures shown in FIG. 1 and 2 are employed in 0.25 μm semiconductor processes, some problems arise. The device malfunction probability is still large when testing for device electricity after the whole semiconductor processes, even though the test result of the self-aligned process is favorable. In other words, the conventional test structure cannot accurately monitor the reliability of the self-aligned process. This leads to an increase of the wafer malfunction probability and capital expenditure.

SUMMARY OF THE INVENTION

Accordingly, the invention provides a method for testing reliability of a self-aligned silicide process. The method can be employed in a 0.25 μm or lower than 0.25 μm semiconductor process.

The invention provides a method for testing reliability of a self-aligned silicide process. The invention uses different test structures to monitor degree of and reason for a current leakage caused by a self-aligned silicide process so as to immediately discover problems, and then immediately resolve the problems.

The invention provides a method for testing reliability of a self-aligned silicide process. In addition to considering a leakage current occurring from a metal silicide layer to the junction and a leakage current occurring at edge of the metal silicide layer, the invention further considers a leakage current occurring from the metal silicide layer to a LDD region and a leakage current occurring at corner of the metal silicide layer adjacent to a shallow trench isolation structure.

Accordingly, the invention provides a method of testing a leakage current caused by a self-aligned silicide process, which is suitable for monitoring the self-aligned silicide process performed on a metal-oxide semiconductor transistor having no lightly doped drain (LDD) structure. At first, parameters for monitoring the self-aligned silicide process are considered. The parameters include an area current density ($J_A$) an edge current density ($J_E$), and a corner current density ($J_C$) A total current (J) of the metal silicide layer is calculated as follows:

$$J = J_A \times A + J_E \times L + J_C \times C,$$

wherein A is an area of the metal silicide layer, L is an edge perimeter of the metal silicide layer, and C is corner number of the metal silicide layer. At least three test structures including a first test structure, a second test structure, and a third test structure are deposited on a wafer. The first test structure, the second test structure and the third test structure respectively comprises a first, a second and a third diffusion regions and a first, a second, and a third metal silicide layer on the first, the second, the third diffusion regions. The first, the second and the third diffusion regions are respectively surrounded by a first, a second, and a third isolation structures, wherein an area of the first metal silicide layer of the first test structure is $A_1$, its edge perimeter is $L_1$, its corner number is $C_1$, an area of the second metal silicide layer of the second test structure is $A_2$, its edge perimeter is $L_2$, its corner number is $C_2$, and an area of the third metal silicide layer of the third test structure is $A_3$, its edge perimeter is $L_3$, and its corner number is $C_3$. Electricity of the first test structure, the second test structure, and the third test structure is measured to respectively obtain total currents $J_1$, $J_2$, and $J_3$; $J_1$, $J_2$, and $J_3$ are then substituted into a total current equation to obtain three linear equations:

$$J_1 = J_A \times A_1 + J_E \times L_1 + J_C \times C_1,$$

$$J_2 = J_A \times A_2 + J_E \times L_2 + J_C \times C_2, \text{ and}$$

$$J_3 = J_A \times A_3 + J_E \times L_3 + J_C \times C_3.$$

The three linear equations are calculated to obtain a set of values for $J_A$, $J_E$, and $J_C$. The self-aligned silicide process is monitored according to the set of values for $J_A$, $J_E$, and $J_C$.

The invention provides another method of testing a leakage current caused by a self-aligned silicide process, which is suitable for monitoring the self-aligned silicide process performed on a metal-oxide semiconductor transistor having a lightly doped drain (LDD) structure. At first, parameters for monitoring the self-aligned silicide process are considered. The parameters comprises an area current density ($J_A$), an interface current density ($J_{isolation,L}$) between the metal silicide layer and a device isolation structure, and a current density ($J_{LDD,L}$) from the metal silicide layer to the LDD region. A total current (J) of the metal silicide layer is calculated as follows:

$$J = J_A \times A + J_{isolation,L} \times L_{isolation} + J_{LDD,L} \times L_{LDD},$$

wherein A is an area of the metal silicide layer, $L_{isolation}$ is an interface perimeter between the metal silicide layer and the device isolation structure, and $L_{LDD}$ is a path of the LDD region. At least three test structures including a first test structure, a second test structure, and a third test structure are deposited on a wafer. The first test structure, the second test structure and the third test structure respectively comprises a first, a second and a third diffusion regions and a first, a second, and a third metal silicide layers respectively on the first, the second, and the third diffusion regions. The first, the second and the third diffusion regions are electrically isolated by a first, a second, and a third isolation structures. At least one of the first, the second, the third diffusion regions has the LDD region, such that an area of the first metal silicide layer of the first test structure is $A_1$, an interface perimeter between the first metal silicide layer and the first device isolation structure is $L_{isolation1}$, a length of the LDD region is $L_{LDD1}$, an area of the second metal silicide layer of the second test structure is $A_2$, an interface perimeter between the second metal silicide layer and the second device isolation structure is $L_{isolation2}$, a length of the LDD region is $L_{LDD2}$, an area of the third metal silicide layer of the third test structure is $A_3$, an interface perimeter between the third metal silicide layer and the third device isolation structure is $L_{isolation3}$, and a length of the LDD region is $L_{LDD3}$. Electricity of the first test structure, the second test structure, and the third test structure are measured to respectively obtain total currents $J_1$, $J_2$, and $J_3$; $J_1$, $J_2$, and $J_3$ are substituted into a total current equation to obtain three linear equations:

$$J_1 = J_A \times A_1 + J_{isolation,L} \times L_{isolation1} + J_{LDD,L} \times L_{LDD1},$$

$$J_2 = J_A \times A_2 + J_{isolation,L} \times L_{isolation2} + J_{LDD,L} \times L_{LDD2}, \text{ and}$$

$$J_3 = J_A \times A_3 + J_{isolation,L} \times L_{isolation3} + J_{LDD,L} \times L_{LDD3},$$

The three linear equations are calculated to obtain a set of values for $J_A$, $J_{isolation,L}$, and $J_{LDD,L}$. The self-aligned silicide process is monitored according to the set of values for $J_A$, $J_{isolation,L}$, and $J_{LDD,L}$.

In addition, the invention further comprises depositing a fourth test structure on the wafer. The fourth test structure comprises a fourth diffusion region and a fourth metal silicide layer on the fourth diffusion region, and the fourth diffusion region has a LDD structure. The fourth diffusion region is electrically isolated by a fourth isolation structure, wherein area of the fourth metal silicide layer of the fourth test structure is $A_4$, an interface perimeter between the fourth metal silicide layer and the fourth device isolation structure is $L_{isolation4}$, and a length of the LDD region is $L_{LDD4}$. The fourth test structure mainly increases the corner number of the fourth metal silicide layer adjacent to the fourth isolation structure. $A_4$, $L_{isolation4}$, $L_{LDD4}$, and the set of values for $J_A$, $J_{isolation,L}$, and $J_{LDD,L}$ are substituted into an equation for the total current to obtain an ideal total current $J_{ideal}$. Electricity of the fourth test structure is measured to obtain an actual total current $J_4$. The self-aligned silicide process is monitored by comparing the actual total current $J_4$ with the ideal total current $J_{ideal}$.

Therefore, while monitoring a self-aligned silicide process performed on a metal-oxide semiconductor transistor without a LDD structure, in addition to considering a leakage current occurring from the metal silicide layer to the junction and a leakage current occurring at edge of the metal silicide layer, the invention further takes a leakage current occurring at corner of the metal silicide layer into consideration. While monitoring a self-aligned silicide process performed on a metal-oxide semiconductor transistor having a LDD structure, the invention further takes a leakage current occurring from the metal silicide layer to the LDD region into consideration. Additionally, in order to avoid a situation where a leakage current occurring at corner of the metal silicide layer adjacent to a shallow trench isolation structure is not immediately monitored, another test structure is added as a check. Thus, reliability of the self-aligned silicide process is more accurately controlled. The self-aligned silicide process can be immediately rectified to reduce probability of useless wafers, and further to enhance device reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

When design rule is reduced to 0.25 μm or less, required quality for a self-aligned process is thus increased. Leakage current caused by metal silicide not only occurs from the metal silicide to the junction and the edge of the metal silicide, but also occurs from the metal silicide to a lightly doped drain (LDD) region and corner of the metal silicide adjacent to a shallow trench isolation (STI) structure. However, the conventional test structures cannot monitor these two mechanisms of leakage current. Therefore, the invention provides a test structure and a test method which can monitor the above-mentioned two mechanisms. The first embodiment illustrates a test structure for monitoring a leakage current caused by a self-aligned silicide layer on a metal-oxide semiconductor (MOS) transistor without a LDD region. The second embodiment illustrates a test structure for monitoring a leakage current caused by a self-aligned silicide on a metal-oxide semiconductor (MOS) transistor having a LDD region.

First Embodiment

Figure 1:
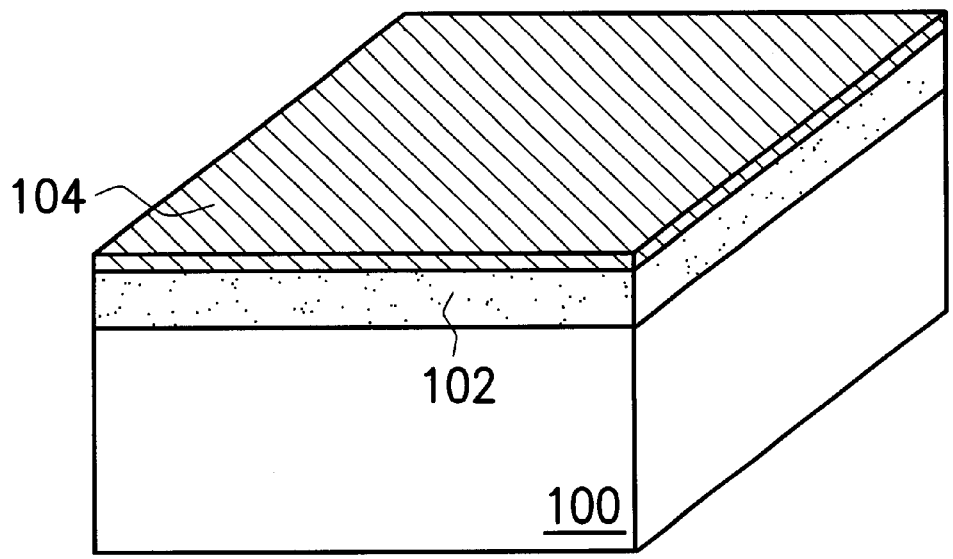
FIG. 1 and FIG. 2 are top views showing two conventional test structures for monitoring a current leakage caused by a self-aligned silicide process.
Figure 2:
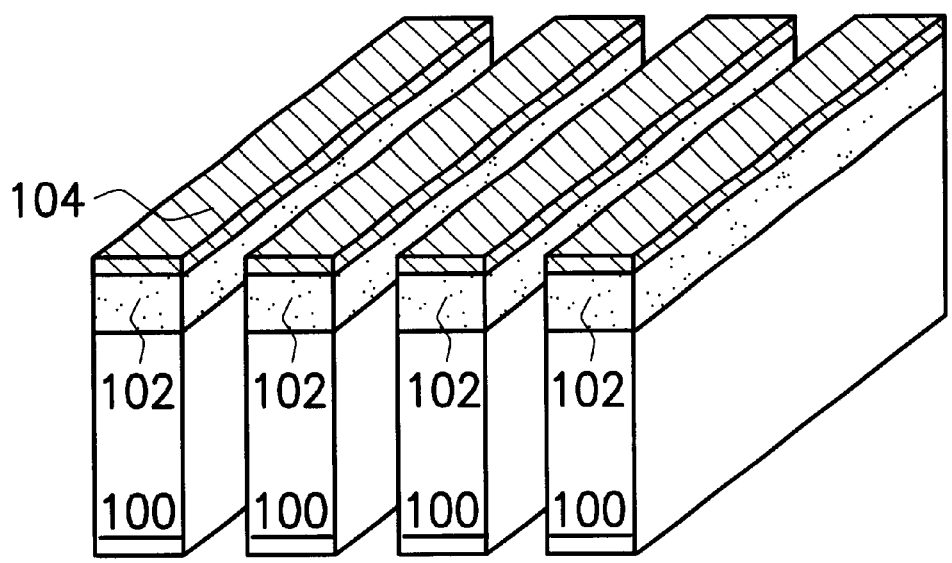
Figure 3:
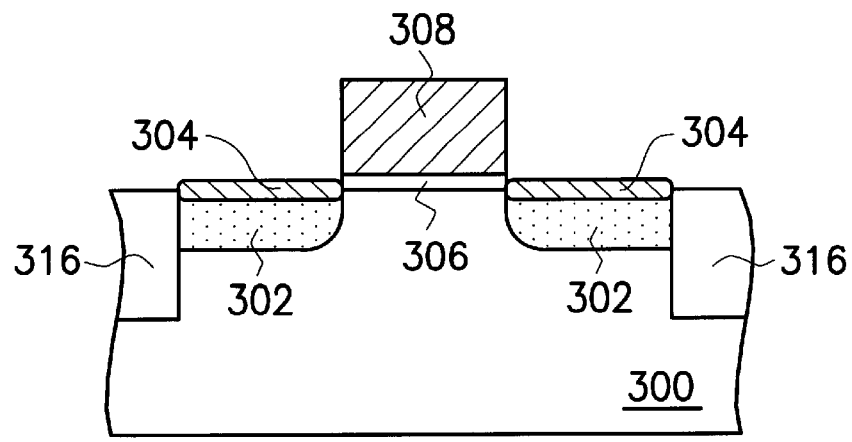
FIG. 3 is a schematic, cross-sectional view of a metal-oxide semiconductor (MOS) transistor without a LDD structure.

FIG. 3 is a schematic, cross-sectional view of a metal-oxide semiconductor (MOS) transistor without a LDD structure. A device isolation structure 316 such as a shallow trench isolation structure is formed on a wafer 300 to define an active region. A well region is formed in the active region of the wafer 300. A gate oxide layer 306 and a gate 308 are formed in the active region. With the gate 308 serving as a mask of an ion implantation, a diffusion region 302 is formed in the well region beside the gate 308. The diffusion region 302 is also called a source/drain region. A self-aligned process is performed to form a metal silicide layer 304 on the diffusion region 302. A portion of silicon in the diffusion region 302 is consumed because of the formation of the metal silicide layer 304. Therefore, if the self-aligned process is not carefully controlled, the electrical quality of the diffusion region 302 is affected so as to easily generate a leakage current. A MOS transistor may fail due to serious leakage current.

This embodiment not only considers a leakage current ($J_A \times A$) occurring from the metal silicide layer to the junction and a leakage current ($J_E \times L$) occurring at the edge of the metal silicide layer, but also considers a leakage current ($J_C \times C$) occurring at the corner of the metal silicide layer adjacent to a shallow trench isolation structure. Thus, reliability of a self-aligned process can be more accurately controlled. Accordingly, a total current (J) is expressed as:

$$J = J_A \times A + J_E \times L + J_C \times C.$$

$J_A$ is an area current density, A is an area of the metal silicide layer, $J_E$ is an edge current density, L is an edge perimeter of the metal silicide layer, $J_C$ is a corner current density, and C is corner number of the metal silicide layer adjacent to the shallow trench isolation structure. When the condition of a self-aligned silicide process is fixed, then $J_A$, $J_E$, and $J_C$ are fixed. Therefore, different total currents J can be obtained through changing conditions A, L, and C so that three liner equations are obtained to obtain a set of values for $J_A$, $J_E$, and $J_C$. Reliability of a self-aligned process can be rectified by $J_A$, $J_E$, and $J_C$.

Figure 4:
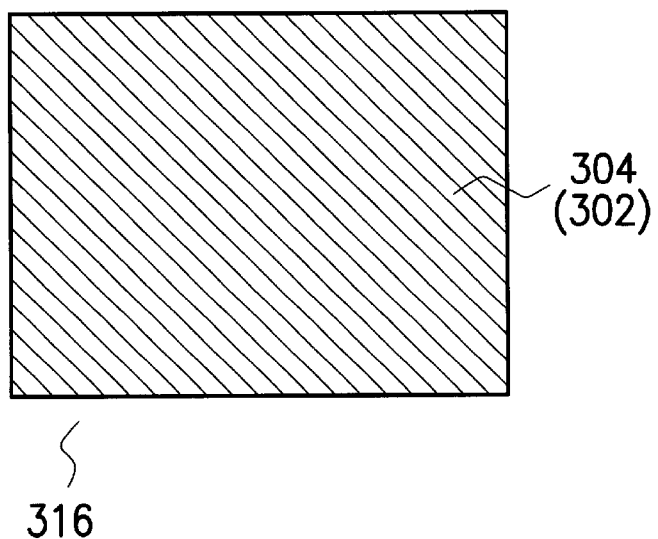
FIG. 4, FIG. 5, and FIG. 6 are top views showing three different test structures which are deposited in scribe lines of a wafer to monitor a self-aligned silicide process according to one preferred embodiment of this invention wherein the test structures are suitable for monitoring a metal silicide on a metal-oxide semiconductor transistor without a LDD region.
Figure 5:
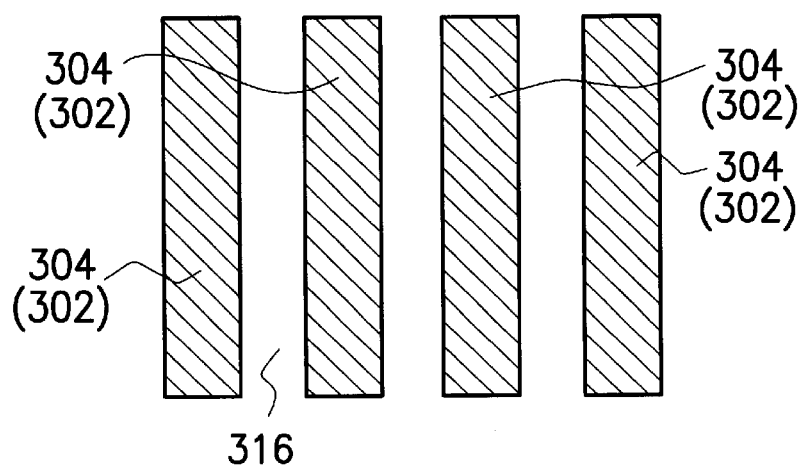
Figure 6:
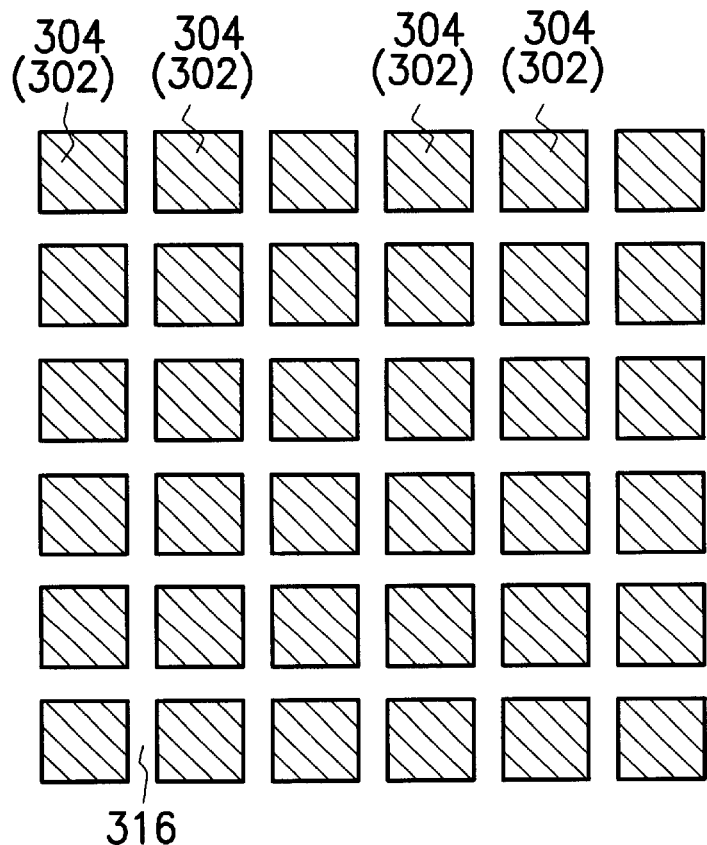

FIG. 4, FIG. 5, and FIG. 6 respectively show three different test structures which are deposited in scribe lines of a wafer to monitor a self-aligned silicide process. The test structure includes a diffusion region 302 and a metal silicide layer 304 thereon. the diffusion region 302 is electrically isolated by a device isolation structure 316 such is a shallow trench isolation structure. A, L, and C of the test structures in FIG. 4, FIG. 5 and FIG. 6 can be obtained through calculation. In the test structure in FIG. 4, the area of a metal silicide layer $A_1$, the edge perimeter $L_1$, and the corner number $C_1$, are obtained through calculation, and then the total current $J_1$ is obtained through an electricity measurement. In the test structure in FIG. 5, the area of a metal silicide layer $A_2$, the edge perimeter $L_2$, and the corner number $C_2$ are obtained through calculation, then the total current $J_2$ is obtained through an electricity measurement. In the test structure in FIG. 6, the area of a metal silicide layer $A_3$, the edge perimeter $L_3$, and the corner number $C_3$ are obtained through calculation, and then the total current $J_3$ is obtained through electricity measurement. Accordingly, three linear equations are expressed as follows:

$$J_1 = J_A \times A_1 + J_E \times L_1 + J_C \times C_1$$

$$J_2 = J_A \times A_2 + J_E \times L_2 + J_C \times C_2$$

$$J_3 = J_A \times A_3 + J_E \times L_3 + J_C \times C_3$$

Thus, one set of values for $J_A$, $J_E$ and $J_C$ can be obtained. The degree of and the reason for a leakage current can be judged according to $J_A$, $J_E$, and $J_C$. Thus, problems can be immediately discovered, and then immediately resolved.

In the above-mentioned test structure, the area of the metal silicide layer ($A_1$, $A_2$, or $A_3$) is generally larger than the edge perimeter ($L_1$, $L_2$, or $L_3$) and the corner number ($C_1$, $C_2$, or $C_3$). Moreover, the orders of $J_A$, $J_E$, and $J_C$ are commonly closed. Therefore, for the total current, contribution of the leakage current ($J_A \times A_1$, $J_A \times A_2$, or $J_A \times A_3$) occurring from the metal silicide layer to the junction is larger than that of the leakage current ($J_E \times L_1$, $J_E \times L_2$, or $J_E \times L_3$) occurring at the edge of the metal silicide layer and that of the leakage current ($J_C \times C_1$, $J_C \times C_2$, or $J_C \times C_3$) occurring at the corner of the metal silicide layer. For the consideration of electricity measurement, the area of the metal silicide layer in FIG. 4, FIG. 5 and FIG. 6 is commonly fixed to lower error when measuring the leakage current occurring at the edge of the metal silicide layer and the leakage current occurring at the corner of the metal silicide layer. Thus, accuracy of test results can be enhanced.

Second Embodiment

Figure 7:
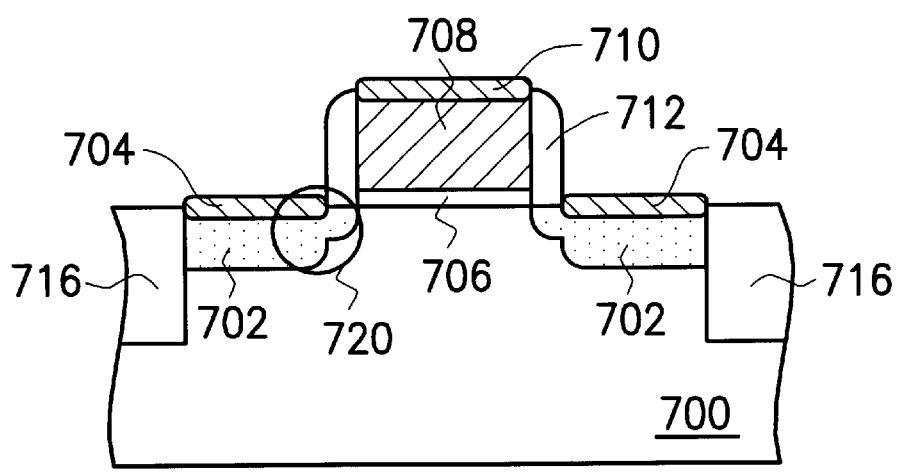
FIG. 7 is a schematic, cross-sectional view of a metal-oxide semiconductor transistor having a lightly doped drain (LDD) structure.

FIG. 7 is a schematic, cross-sectional view of a metal-oxide semiconductor transistor having a lightly doped drain (LDD) structure. A device isolation structure 716 such as a shallow trench isolation structure is formed on a wafer 700 to define an active region. A well region is formed in the active region of the wafer 700. A gate oxide layer 706 and a gate 708 are formed in the active region. With the gate 708 serving as a mask, a first lightly doped ion implantation is performed. A spacer 712 is formed on a sidewall of the gate 708. With the gate 708 and the spacer 712 serving as a mask, a second ion implantation is performed to form a diffusion region 702 in the well region of the wafer 700. The diffusion region 702 is so-called a source/drain region having a LDD structure. A self-aligned process is performed to form a metal silicide layer 704 on the diffusion region 702 and a metal silicide layer 710 on the gate 708. A portion of silicon of the diffusion region 702 is consumed because of the formation of the metal silicide 704. Therefore, if the self-aligned process is not well controlled, electricity quality of the diffusion region 702 is affected so as to easily lead to a leakage current. A MOS transistor may fail due to a serious leakage current.

This embodiment not only considers a leakage current ($J_A \times A$) occurring from the metal silicide layer to the junction and a leakage current ($J_{isolation,L} \times L_{isolation}$) occurring at the edge of the metal silicide layer, but also considers a leakage current ($J_{LDD,L} \times L_{LDD}$) occurring from the metal silicide layer to the LDD region, that is, the region denoted as 720 in FIG. 7. Accordingly, a total current (J) is expressed as:

$$J = J_A \times A + J_{isolation,L} \times L_{isolation} + J_{LDD,L} \times L_{LDD}$$

where $J_A$ is an area current density, A is an area of the metal silicide layer, $J_{isolation,L}$ is an interface current density between the metal silicide layer and the device isolation structure, $L_{isolation}$ is the interface perimeter between the metal silicide layer and the device isolation structure, $J_{LDD,L}$ is a current density from the metal silicide layer to the LDD region, and $L_{LDD}$ is the length of the LDD region. When the condition of a self-aligned silicide process is fixed, then $J_A$, $J_{isolation,L}$, and $J_{LDD,L}$ are fixed. Therefore, different total currents J can be obtained through changing conditions A, $L_{isolation}$, and $L_{LDD}$ so that three liner equations are obtained to obtain a set of values for $J_A$, $J_{isolation,L}$, and $J_{LDD,L}$. Reliability of a self-aligned process can be judged by judging $J_A$, $J_{isolation,L}$, and $J_{LDD,L}$.

Figure 8:
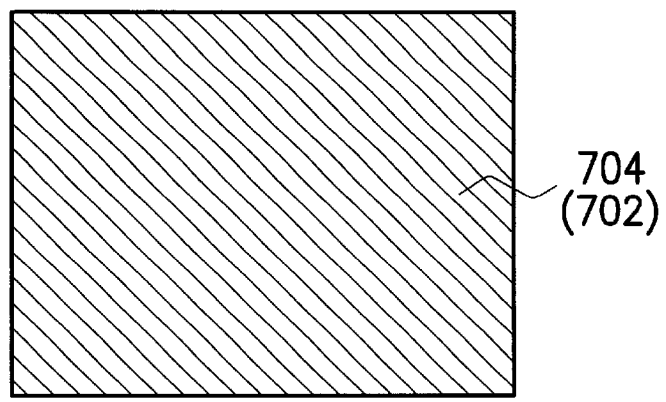
FIG. 8, FIG. 9, FIG. 10 and FIG. 11 respectively show four different test structures which are deposited in scribe lines of a wafer to monitor a self-aligned silicide process, wherein the test structures are suitable for monitoring a metal silicide on a metal-oxide semiconductor transistor having a LDD region.
Figure 9:
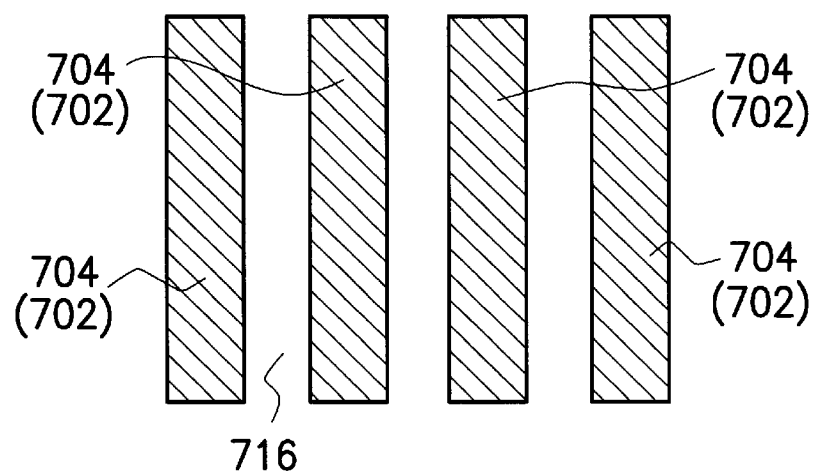
Figure 10:
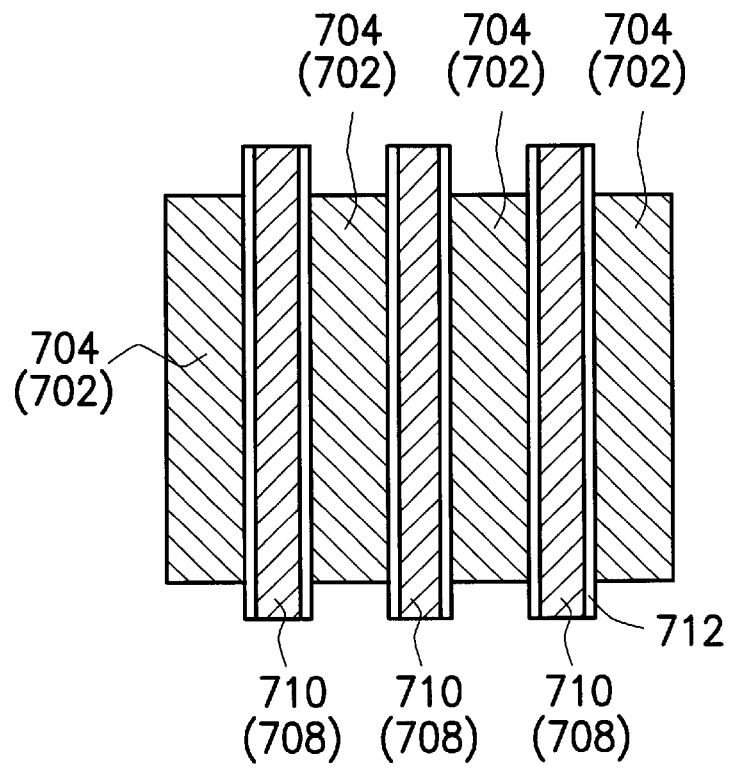

FIG. 8, FIG. 9, and FIG. 10 respectively show three different test structures which are deposited in scribe lines of a wafer to monitor a self-aligned silicide process. The test structure includes a diffusion region 702 and a metal silicide layer 704 thereon wherein at least one of the three test structures has a diffusion region 702 with a LDD structure, as shown in FIG. 10. The diffusion region 716 is electrically isolated by a device isolation structure 316 such as a shallow trench isolation structure. A, $L_{isolation}$, and $L_{LDD}$ of the test structures in FIG. 8, FIG. 9 and FIG. 10 can be obtained through calculation. In the test structure in FIG. 8, the area of a metal silicide layer $A_1$, the interface perimeter between the metal silicide layer and the device isolation structure $L_{isolation1}$, and the length of the LDD region $L_{LDD1}$ are obtained by calculation, then the total current $J_1$ is obtained through electricity measurement. In the test structure in FIG. 9, the area of a metal silicide layer $A_2$, the interface perimeter between the metal silicide layer and the device isolation structure $L_{isolation2}$, and the length of the LDD region $L_{LDD\,2}$ are obtained by calculation, and then the total current $J_2$ is obtained through electricity measurement. In the test structure in FIG. 10, the area of a metal silicide layer $A_3$, the interface perimeter between the metal silicide layer and the device isolation structure $L_{isolation3}$, and the length of the LDD region $L_{LDD3}$ are obtained by calculation, and then the total current $J_3$ is obtained through electricity measurement. Accordingly, three linear equations are expressed as follows:

$$J_1 = J_A \times A_1 + J_{isolation,L} \times L_{isolation1} + J_{LDD,L} \times L_{LDD\,1}$$

$$J_2 = J_A \times A_2 + J_{isolation,L} \times L_{isolation2} + J_{LDD,L} \times L_{LDD\,2}$$

$$J_3 = J_A \times A_3 + J_{isolation,L} \times L_{isolation3} + J_{LDD,L} \times L_{LDD\,3}$$

Thus, one set of $J_A$, $J_{isolation,L}$, and $J_{LDD,L}$ values can be obtained. The degree of and the reason for a leakage current are judged according to $J_A$, $J_{isolation,L}$, and $J_{LDD,L}$. Thus, problems can be immediately discovered, and then immediately resolved.

In the above-mentioned test structure, for the total current, the contribution of the leakage current ($J_A \times A_1$, $J_A \times A_2$, or $J_A \times A_3$) occurring from the metal silicide layer to the junction is larger than that of the leakage current ($J_{isolation,L} \times L_{isolation1}$, $J_{isolation,L} \times L_{isolation2}$, or $J_{isolation,L} \times L_{isolation3}$) occurring at the interface between the metal and that of the leakage current ($J_{LDD,L} \times L_{LDD1}$, $J_{LDD,L} \times L_{LDD2}$, or $J_{LDD,L} \times L_{LDD3}$) occurring from the metal silicide layer to the LDD region. For the consideration of electricity measurement, the area of the metal silicide layer in FIG. 8, FIG. 9 and FIG. 10 is commonly fixed to lower error of measuring the leakage current occurring at the interface between the metal silicide layer and the device isolation structure. Thus, accuracy of test results can be enhanced.

Figure 11:
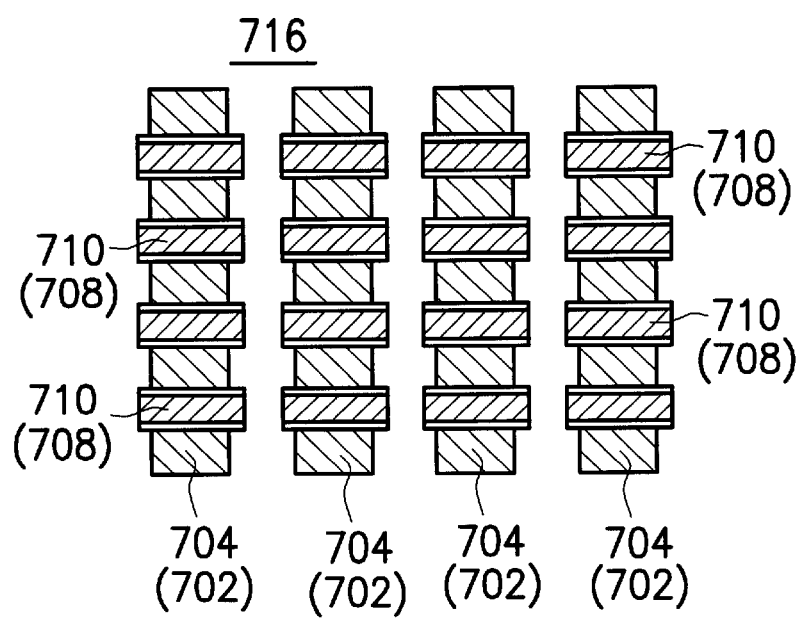

In addition to the test structures in FIG. 8, FIG. 9 and FIG. 10, another test structure can be deposited in the scribe line, as shown in FIG. 11. The test structure in FIG. 11 mainly increases the corner number of the metal silicide layer adjacent to the shallow trench isolation structure. In FIG. 11, through calculation, the area of the metal silicide layer, $A_4$, the perimeter of the interface between the metal silicide layer and the device isolation structure, $L_{isolation4}$, and length of the LDD region, $L_{LDD4}$ can be obtained. $J_A$, $J_{isolation,L}$, and $J_{LDD,L}$ obtained from the test structures in FIG. 8, FIG. 9, and FIG. 10 are substituted into the equation for the total current, then an ideal total current $J_{ideal}$ is obtained as followed:

$$J_{ideal} = J_A \times A_4 + J_{isolation,L} \times L_{isolation4} + J_{LDD,L} \times L_{LDD,4}$$

In addition, the actual total current is $J_4$ through electricity measurement. Compared with the actual total current $J_4$ and the ideal total current $J_{ideal}$, in the case where the difference between $J_4$ and $J_{ideal}$ is in an allowable range, the leakage current occurring at the corner of the metal silicide layer is in an allowable range, or no leakage current occurs. In the case that the difference between $J_4$ and $J_{ideal}$ is too large, the self-aligned silicide process has to be adjusted.

In general, the area of the metal silicide layer in FIG. 11 is the same as the areas in FIG. 8, FIG. 9 and FIG. 10 to enhance accuracy of the test result.

Accordingly, advantages of the invention are as followed:

(1) While monitoring a self-aligned silicide process of a metal-oxide semiconductor transistor without a LDD structure, in addition to considering a leakage current occurring from a metal silicide layer to the junction and a leakage current occurring at the edge of the metal silicide layer in a conventional method, the invention further takes a leakage current occurring at a corner of a metal silicide layer into consideration. Thus, reliability of a self-aligned silicide process can be accurately controlled. The self-aligned silicide process can be immediately rectified to reduce probability of nullified wafers, further enhancing device reliability.

(2) While monitoring a self-aligned silicide process of a metal-oxide semiconductor transistor having a LDD structure, in addition to considering a leakage current occurring from a metal silicide layer to the junction and a leakage current occurring at the edge of the metal silicide layer in a conventional method, the invention further takes a leakage current occurring from a metal silicide layer to the LDD region into consideration. Thus, reliability of a self-aligned silicide process can be accurately controlled. The self-aligned silicide process can be immediately rectified to reduce probability of nullified wafers, further enhancing device reliability.

(3) While monitoring a self-aligned silicide process of a metal-oxide semiconductor transistor having a LDD structure, the invention further takes a leakage current occurring from a metal silicide layer to the LDD region into consideration. In order to avoid a failure to detect a serious leakage current occurring at corner of the metal silicide adjacent to a shallow trench isolation structure, another test structure is added as a check. The feature of the test structure is to increase the corner number of a metal silicide layer adjacent to a shallow trench isolation structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of testing a leakage current caused by a self-aligned silicide process, suitable for monitoring the self-aligned silicide process performed on a metal-oxide semiconductor transistor having no lightly doped drain (LDD) structure, the method comprising:

considering parameters for monitoring the self-aligned silicide process, the parameters comprising an area current density ($J_A$), an edge current density ($J_E$), and a corner current density ($J_C$), a total current (J) of the metal silicide layer being calculated from an equation as follows:

$$J = J_A \times A + J_E \times L + J_C \times C,$$

wherein A is an area of the metal silicide layer, L is an edge perimeter of the metal silicide layer, and C is a corner number for the metal silicide layer;

depositing at least three test structures comprising a first test structure, a second test structure, and a third test structure on a wafer, the first test structure, the second test structure and the third test structure respectively comprising a first, a second and a third diffusion regions and a first, a second, and a third metal silicide layer on the first, the second, the third diffusion regions, the first, the second and the third diffusion regions being respectively surrounded by a first, a second, and a third isolation structures, wherein an area of the first metal silicide layer of the first test structure is $A_1$, its edge perimeter is $L_1$, its corner number is $C_1$, an area of the second metal silicide layer of the second test structure is $A_2$, its edge perimeter is $L_2$, its corner number is $C_2$, and an area of the third metal silicide layer of the third test structure is $A_3$, its edge perimeter is $L_3$, its corner number is $C_3$;

measuring electricity of the first test structure, the second test structure, and the third test structure to respectively obtain total currents $J_1$, $J_2$, and $J_3$, and then substituting these values into a total current equation to obtain three linear equations:

$$J_1 = J_A \times A_1 + J_E \times L_1 + J_C \times C_1,$$

$$J_2 = J_A \times A_2 + J_E \times L_2 + J_C \times C_2, \text{ and}$$

$$J_3 = J_A \times A_3 + J_E \times L_3 + J_C \times C_3,$$

which three linear equations are then used to obtain a set of values for $J_A$, $J_E$, and $J_C$; and monitoring the self-aligned silicide process according to the set of values for $J_A$, $J_E$, and $J_C$.

2. The method according to claim 1, wherein the first test structure, the second test structure, the third test structure are deposited in a scribe line.

3. The method according to claim 1, wherein the first isolation structure, the second isolation structure, and the third isolation structure include shallow trench isolation structures.

4. The method according to claim 1, the method further including fixing the area of the first metal silicide layer $A_1$, the area of the second metal silicide layer $A_2$, and the area of the third metal silicide layer $A_3$.

5. A method of testing a leakage current caused by a self-aligned silicide process, suitable for monitoring the self-aligned silicide process performed on a metal-oxide semiconductor transistor having a lightly doped drain (LDD) structure, the method comprising:

considering parameters for monitoring the self-aligned silicide process, the parameters comprising an area current density ($J_A$), an interface current density ($J_{isolation,L}$) between the metal silicide layer and a device isolation structure, and a current density ($J_{LDD,L}$) from the metal silicide layer to the LDD region, a total current (J) of the metal silicide layer being calculated from an equation as follows:

$$J = J_A \times A + J_{isolation,L} \times L_{isolation} + J_{LDD,L} \times L_{LDD},$$

wherein A is an area of the metal silicide layer, $L_{isolation}$ is an interface perimeter between the metal silicide layer and the device isolation structure, and $L_{LDD}$ is a length of the LDD region;

depositing at least three test structures comprising a first test structure, a second test structure, and a third test structure on a wafer, the first test structure, the second test structure and the third test structure respectively comprising a first, a second and a third diffusion regions and a first, a second, and a third metal silicide layers respectively on the first, the second, and the third diffusion regions, the first, the second and the third diffusion regions being electrically isolated by a first, a second, and a third isolation structures, at least one of the first, the second, the third diffusion regions having the LDD region, wherein an area of the first metal silicide layer of the first test structure is $A_1$, an interface perimeter between the first metal silicide layer and the first device isolation structure is $L_{isolation1}$, a length of the LDD region is $L_{LDD1}$, an area of the second metal silicide layer of the second test structure is $A_2$, an interface perimeter between the second metal silicide layer and the second device isolation structure is $L_{isolation2}$, a length of the LDD region is $L_{LDD2}$, an area of the third metal silicide layer of the third test structure is $A_3$, an interface perimeter between the third metal silicide layer and the third device isolation structure is $L_{isolation3}$, and a path of the LDD region is $L_{LDD3}$;

measuring electricity of the first test structure, the second test structure, and the third test structure to respectively obtain total currents $J_1$, $J_2$, and $J_3$, and substituting these into a total current equation to obtain three linear equations:

$$J_1 = J_A \times A_1 + J_{isolation,L} \times L_{isolation1} + J_{LDD,L} \times L_{LDD1},$$

$$J_2 = J_A \times A_2 + J_{isolation,L} \times L_{isolation2} + J_{LDD,L} \times L_{LDD2}, \text{ and}$$

$$J_3 = J_A \times A_3 + J_{isolation,L} \times L_{isolation3} + J_{LDD,L} \times L_{LDD3},$$

which three linear equations are then used to obtain a set of values for $J_A$, $J_{isolation,L}$, and $J_{LDD,L}$; and monitoring the self-aligned silicide process according to the set of values for $J_A$, $J_{isolation,L}$, and $J_{LDD,L}$.

6. The method according to claim 5, wherein the first test structure, the second test structure, the third test structure are deposited in a scribe line.

7. The method according to claim 5, wherein the first isolation structure, the second isolation structure, and the third isolation structure include shallow trench isolation structures.

8. The method according to claim 5, the method further comprising fixing the area of the first metal silicide layer $A_1$, the area of the second metal silicide layer $A_2$, and the area of the third metal silicide layer $A_3$.

9. The method according to claim 5, the method further comprising:

depositing a fourth test structure on the wafer, the fourth test structure comprising a fourth diffusion region and a fourth metal silicide layer on the fourth diffusion region, the fourth diffusion region having the LDD structure, the fourth diffusion region being electrically isolated by a fourth isolation structure, wherein area of the fourth metal silicide layer of the fourth test structure is $A_4$, an interface perimeter between the fourth metal silicide layer and the fourth device isolation structure is $L_{isolation4}$, a length of the LDD region is $L_{LDD4}$, wherein the fourth test structure mainly increases a corner number of the fourth metal silicide layer adjacent to the fourth isolation structure;

substituting $A_4$, $L_{isolation4}$, $L_{LDD4}$, and the set of values for $J_A$, $J_{isolation,L}$, and $J_{LDD,L}$ into an equation for the total current to obtain an ideal total current $J_{ideal}$; and measuring electricity of the fourth test structure to obtain an actual total current $J_4$; and monitoring the self-aligned silicide process by comparing the actual total current $J_4$ with the ideal total current $J_{ideal}$.

10. The method according to claim 9, wherein the first test structure, the second test structure, the third test structure, and the fourth test structure are deposited in a scribe line.

11. The method according to claim 9, wherein the first isolation structure, the second isolation structure, the third isolation structure, and the fourth isolation structure include shallow trench isolation structures.

12. The method according to claim 9, the method further including fixing the area of the first metal silicide layer $A_1$, the area of the second metal silicide layer $A_2$, the area of the third metal silicide layer $A_3$, and the area of the fourth metal silicide layer $A_4$.

* * * * *